United States Patent [19]
Feldman

[11] Patent Number: 5,606,318
[45] Date of Patent: Feb. 25, 1997

[54] APPARATUS FOR CONVERSION OF SCALED BINARY DATA

[75] Inventor: Alan S. Feldman, Phoenix, Ariz.

[73] Assignee: Honeywell Inc., Minneapolis, Minn.

[21] Appl. No.: 316,317

[22] Filed: Sep. 30, 1994

[51] Int. Cl.$^6$ ............... H03M 1/16; H03M 1/20
[52] U.S. Cl. ............... 341/102; 341/139; 341/95
[58] Field of Search ............... 341/102, 139, 341/118, 145, 110, 95, 50, 61, 144, 138

[56] References Cited

U.S. PATENT DOCUMENTS

| | | | |
|---|---|---|---|
| 3,956,746 | 5/1976 | Lisle, Jr. et al. | 341/127 |
| 4,642,608 | 2/1987 | Tomasi | 341/131 |
| 4,983,966 | 1/1991 | Grone et al. | 341/84 |
| 5,146,155 | 9/1992 | Trinh Van et al. | 324/99 |
| 5,278,558 | 1/1994 | Roth | 341/120 |

Primary Examiner—Jeffrey A. Gaffin
Assistant Examiner—Peguy JeanPierre
Attorney, Agent, or Firm—A. A. Sapelli; R. E. Champion

[57] ABSTRACT

An apparatus converts m-bit digital data having a scale factor of $K_1$ to n-bit digital data having a scale factor of $K_2$. The apparatus comprises a digital to analog converter which receives the m-bit digital data, for outputting a first analog signal representative of a value associated with the m-bit digital data. An amplifier receives the first analog signal multiplies it by a factor, and outputs a second analog signal. The factor of the amplifier is $K_2/K_1$, such that the second analog signal has a value with the scale factor of $K_2$ associated therewith. An analog to digital converter receives the second analog signal, and converts the second analog signal to the n-bit digital data. The n-bit digital data has the scale factor of $K_2$ associated therewith, the value representative of the n-bit digital data being essentially equal in the example of the present application to the value representative of the m-bit digital data, however, this is not always a requirement.

11 Claims, 7 Drawing Sheets

1

APPARATUS FOR CONVERSION OF SCALED BINARY DATA

BACKGROUND OF THE INVENTION

The present invention relates to digital data processing, and more particularly, to an apparatus for converting scaled binary data.

Prior to microprocessors and other sophisticated digital processing techniques, digital information was transmitted to indicators via analog voltages and synchro data. Specifically, bearing data from a TACAN receiver is a serially transmitted 32-bit word. There are differing applications in which binary data must occasionally be scaled and/or have its resolution change. Even with microprocessors or digital hardware, complicated software or a significant amount of circuitry is necessary to put bearing information into a desired format such as an ARINC format (e.g., ARINC 429, ARINC 568, ARINC 419, . . . ) Converting, for example, a digital word of 8-bit data with one scale factor to 12-bit data word with another scale factor, or, in general, converting m-bit data with a scale factor of $K_1$ to n-bit data with a scale factor of $K_2$, employing digital techniques is not a small undertaking.

Thus, there is a need to provide a way of converting digital data from one format to another in a simple, accurate, and quick manner. The apparatus of the present invention provides an apparatus which converts an m-bit data word having a scale factor of $K_1$, to an n-bit data word having a scale factor of $K_2$ in a simple manner with many significant advantages. The advantages include expandability, provide for an offset of the converted data, scale variability, an increase in accuracy/resolution, . . .

SUMMARY OF THE INVENTION

Therefore, there is provided by the present invention, an apparatus which converts m-bit data having a first scale factor to n-bit data having a second scale factor. The apparatus comprises a digital to analog converter, having an input adapted to receive the m-bit digital data, for outputting a first analog signal representative of a value associated with the m-bit digital data. An amplifier, operatively connected to the digital to analog converter, receives the first analog signal to output a second analog signal, the amplifier having a factor of $K_2/K_1$. The second analog signal is equal to the first analog signal multiplied by the factor, such that the second analog signal has a value with the scale factor of $K_2$ associated therewith. An analog to digital converter, having an input adapted to receive the second analog signal, converts the second analog signal to the n-bit digital data. The n-bit digital data has the scale factor of $K_2$ associated therewith, the value representative of the n-bit digital data being essentially equal to the value representative of the m-bit digital data.

Accordingly, it is an object of the present invention to provide an apparatus for converting m-bit data having a first scale factor to n-bit data having a second scale factor.

It is another object of the present invention to provide an apparatus for converting m-bit data having a first scale factor to n-bit data having a second scale factor wherein the second scale factor relative to the first scale factor is easily modifiable.

It is still another object of the present invention to provide an apparatus for converting m-bit data having a first scale factor to n-bit data having a second scale factor wherein the converted data includes an offset.

These and other objects of the present invention will become more apparent when taken in conjunction with the following description and attached drawings, wherein like characters indicate like parts, and which drawings form a part of the present application.

DETAILED DESCRIPTION

Figure 1:
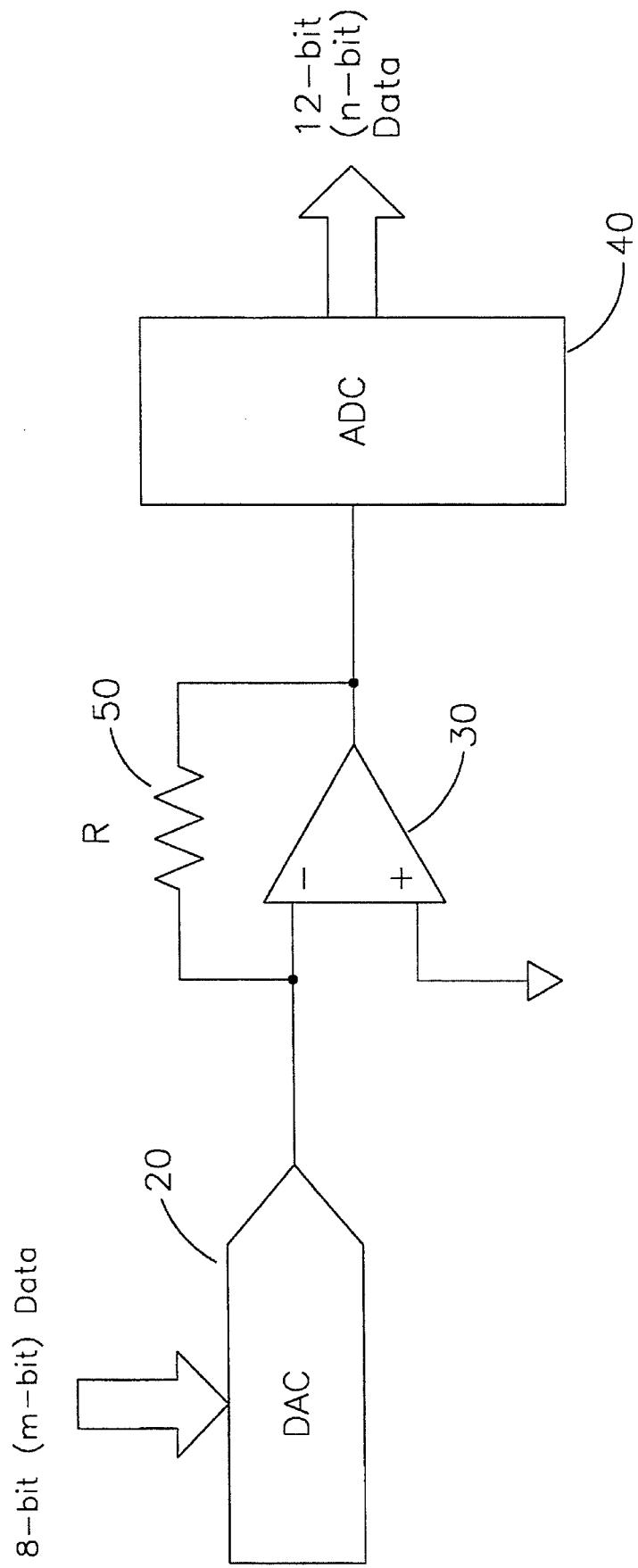
FIG. 1 shows a block diagram of the preferred embodiment of the present invention.

Referring to FIG. 1, there is shown a block diagram of the preferred embodiment of the present invention. The apparatus of FIG. 1 converts 8-bit data having one scale factor to 12-bit data having another scale factor or, in general, converts m-bit data with a scale factor of $K_1$ to n-bit data with a scale factor of $K_2$. The present invention performs this conversion relatively simply by using a combined digital to analog (D/A) and analog to digital (A/D) techniques. A Digital-to-Analog Converter (DAC) 20 converts the 8-bit, or m-bit, data to a current, attenuating or amplifying the current properly with an operational amplifier 30, and then converts the scaled voltage back to digital data with a 12-bit, or n-bit, Analog-to-Digital Converter (ADC) 40. This conversion is accomplished quickly and includes many significant advantages.

Figure 2:
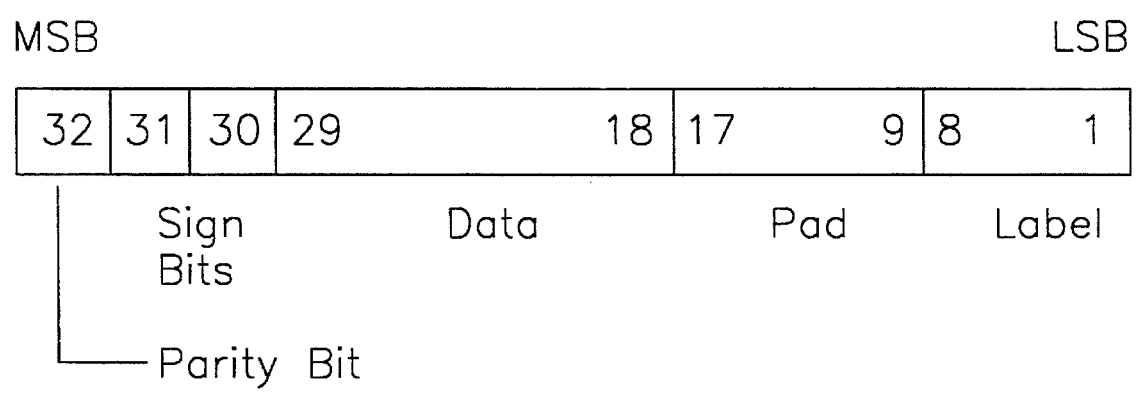
FIG. 2 shows a word format of a 32-bit TACAN receiver.

In the preferred embodiment of the present invention, bearing data from a TACAN receiver is a serially transmitted 32-bit word, having a format as shown in FIG. 2. Of primary interest is the 12 data bits which are weighted as shown in Table 1.

TABLE 1

| Bit 18 | 90° | × | $2^{-11}$ | = | 0.0439453125 |
|---|---|---|---|---|---|
| Bit 19 | 90° | × | $2^{-10}$ | = | 0.087890625 |
| Bit 20 | 90° | × | $2^{-9}$ | = | 0.17578125 |
| Bit 21 | 90° | × | $2^{-8}$ | = | 0.3515625 |
| Bit 22 | 90° | × | $2^{-7}$ | = | 0.703125 |
| Bit 23 | 90° | × | $2^{-6}$ | = | 1.40625 |
| Bit 24 | 90° | × | $2^{-5}$ | = | 2.8125 |
| Bit 25 | 90° | × | $2^{-4}$ | = | 5.625 |
| Bit 26 | 90° | × | $2^{-3}$ | = | 11.25 |
| Bit 27 | 90° | × | $2^{-2}$ | = | 22.5 |
| Bit 28 | 90° | × | $2^{-1}$ | = | 45.0 |
| Bit 29 | 90° | × | $2^{0}$ | = | 90.0 |

The sum of the 12-bit data stream gives the absolute value of the bearing. Sign information, bits 30 and 31, determines if the bearing is positive or negative relative to magnetic North. The 12-bits of data, represented in fractional notation, is $$\text{Bearing} = 90° \times (2^0 + 2^{-1} + \ldots + 2^{-10} + 2^{-11}).$$

A TACAN receiver simulation converts 8-bit data with a scale factor of 128 to 12-bit data with a scale factor of 90. Stated differently:

$$128 \times (2^0 + \ldots + 2^{-7}) = 90 \times (2^0 + \ldots + 2^{-11}) \qquad (1)$$

These two numbers, are approximately equal to each other due to resolution limitations. (There are three unique cases; 45°, 90° and 135°, where they are equal to each other as will be discussed hereinunder.)

Eight bit data having a scale factor of 128 are weighted as shown in Table 2.

TABLE 2

| 128° | × | $2^{-7}$ | = | 1.0 |
| 128° | × | $2^{-6}$ | = | 2.0 |
| 128° | × | $2^{-5}$ | = | 4.0 |
| 128° | × | $2^{-4}$ | = | 8.0 |
| 128° | × | $2^{-3}$ | = | 16.0 |
| 128° | × | $2^{-2}$ | = | 32.0 |
| 128° | × | $2^{-1}$ | = | 64.0 |
| 128° | × | $2^{-0}$ | = | 128.0 |

Thus it can be seen that the data for 45°, 90°, and 135°, for the 8-bit data and the 12-bit data are equal to each other and have the corresponding data value as shown in Table 3.

TABLE 3

| Bearing Value | 8-Bit Data | 12-Bit Data |
| --- | --- | --- |
| 45° | 00 101 101 | 010 000 000 000 |
| 90° | 01 011 010 | 100 000 000 000 |
| 135° | 10 000 111 | 110 000 000 000 |
| 46° | 00 101 110 | 010 000 010 111 |
| 75° | 01 001 011 | 011 010 101 010 |

The digital value of a bearing word of 46° for the 12-bit data is also shown in Table 3. Applying the weight of each bit of the 12-bit data word according to Table 1 indicates a value of 46.010742 for the 12-bit data word. Thus, as was mentioned above for equation (1), the bearing values for the 8-bit data compared to the bearing value for the 12-bit data are approximately equal to each other, except for the three (3) case where the values are exactly equal to each other.

For the bearing value of 46°, the binary value of the 8-bit data of 0.00 101 110 corresponds to a decimal number value of 0.1796875 (where the binary value is taken as a pure binary number without the scale factor and has the binary point as shown). If the resistor (R) 50 value of the operational amplifier 30 has a value such that the gain of the operational amp 30 is 1.4222 in this example (where gain is $K_2/K_1$ or $128/90$) then the output of the operation amplifier 30 is 0.255615 which equates to a pure binary number having 12-bit data of 0.010 000 010 111. This binary value is the value of 46° bearing as shown in Table 3. The values for 75° are also shown in Table 3. Thus, for an 8-bit data of 01 001 011 input to DAC 20 an analog output value of 0.2929687 is outputted. This value is inputted to the operational amp 30 having a gain of 1.4222 resulting in an analog output of 0.4166659 from the Op Amp 30. After the conversion of this value by the ADC 30, the output of the ADC 40 is 011 010 101 010, a 12-bit data value which corresponds to 74.9707 degrees bearing value. Thus it can be readily seen that the 8-bit data is readily converted by the apparatus of the present invention without requiring the relatively complex software of a processor in a purely digital domain.

Figure 3:
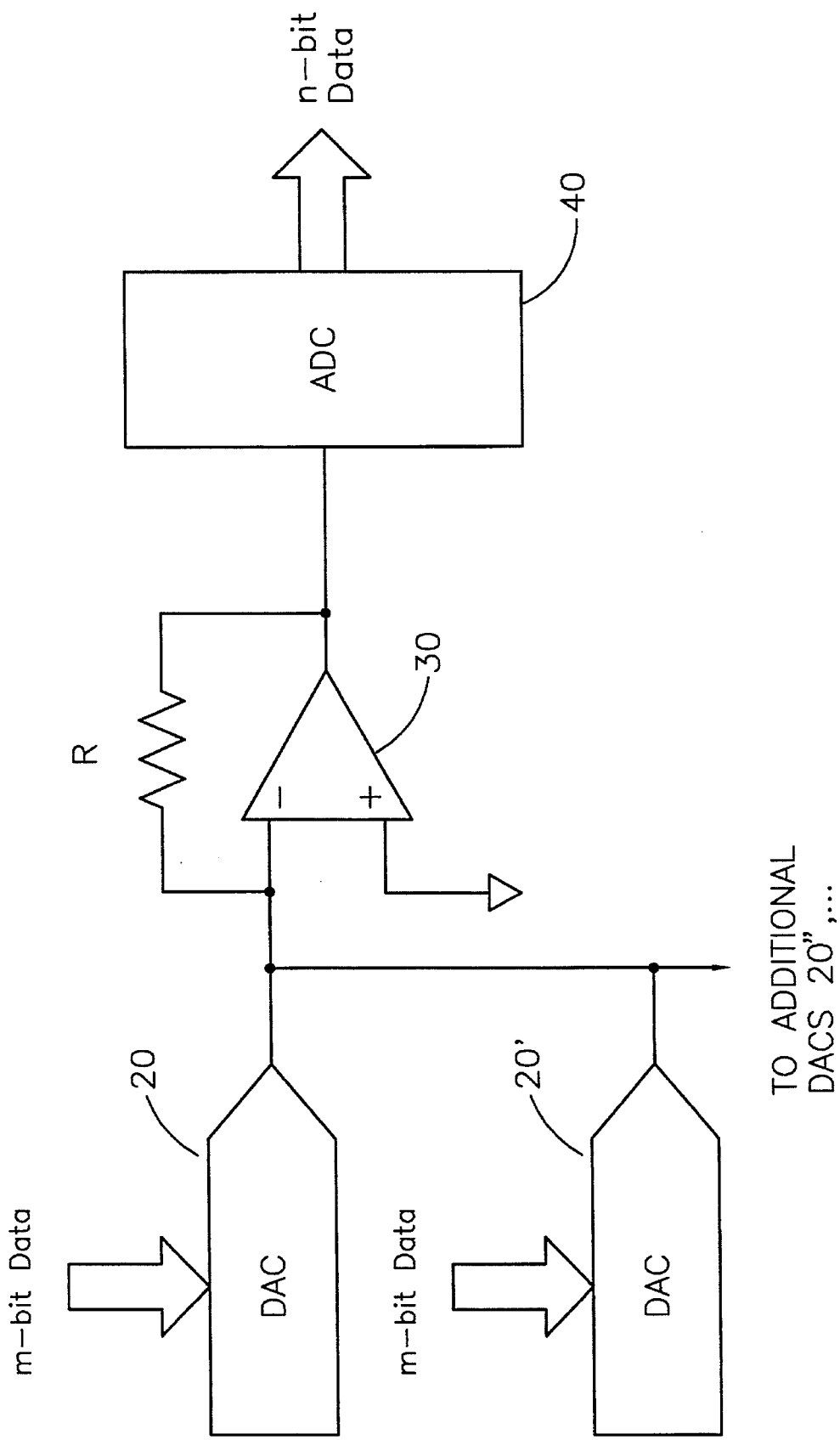
FIG. 3 shows an alternative embodiment of the present invention of FIG. 1.

In an alternative embodiment of the present invention, one of the many advantages of the present invention can be readily seen. By adding additional DACs 20', 20", . . . , such as is shown in FIG. 3, the accuracy or resolution of the data is increased, e.g., the fine portion of coarse and fine bearing information. Thus a bearing of 162°, for example, could be expressed as 162.32°. This expression could be expanded in either direction of more significant digits or less significant digits, as long as the scaling is processed correctly.

Figure 4:
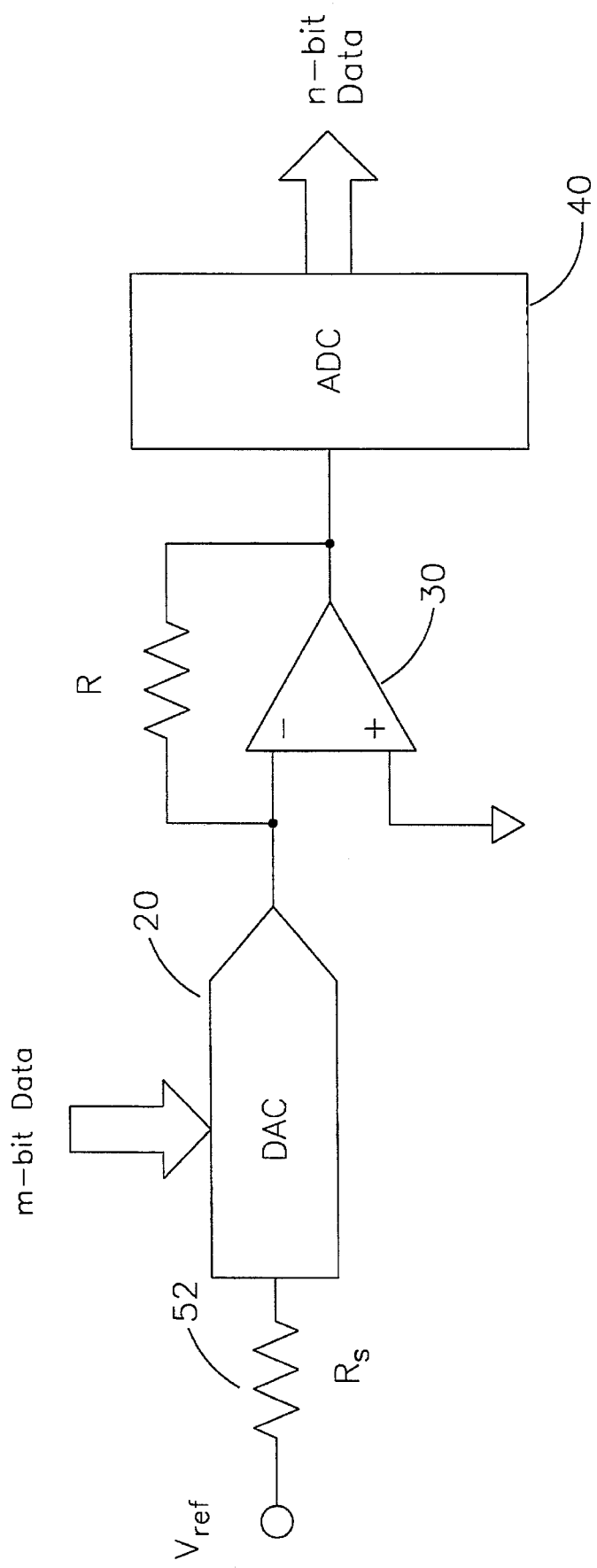
FIG. 4 shows another alternative embodiment of the present invention of FIG. 1.

In the embodiment of FIG. 4, there is shown an embodiment for varying the scaling of the m-bit data input to DAC 20. The DAC 20 includes a reference voltage $V_{ref}$ and a resistor $R_s$ 52. By varying the reference voltage, or the resistor 52, the scaling of the output of DAC 20 is readily changed.

Figure 5:
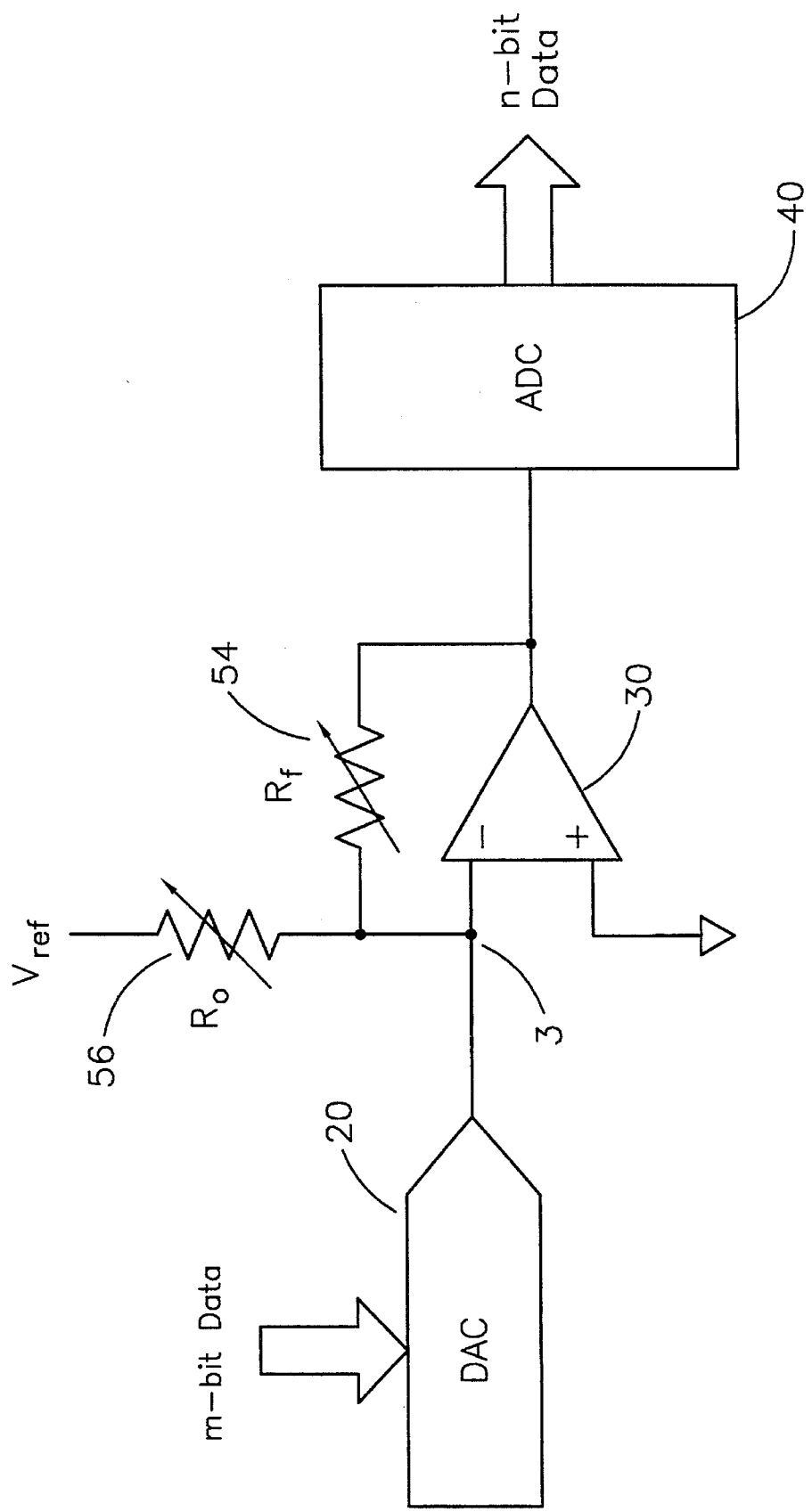
FIG. 5 shows yet another alternative embodiment of the present invention of FIG. 1.

In the embodiment of FIG. 5, there is shown an embodiment for providing scaling changes and offset of the data. A variable resistor $R_f$ 54, providing a feedback path of operational amp 30, can be varied to modify scaling. An additional advantage to employing this technique is that any gain error that may be present in the DAC and/or the ADC, can be removed with a single adjustment. Injecting current at the summing junction 3 of the Op Amp 30 results in an offset provided by variable resistor $R_o$ 56. Again, an additional advantage to employing this technique is that any offset error that is present in the DAC and/or the ADC, can be removed with a single adjustment.

Figure 6:
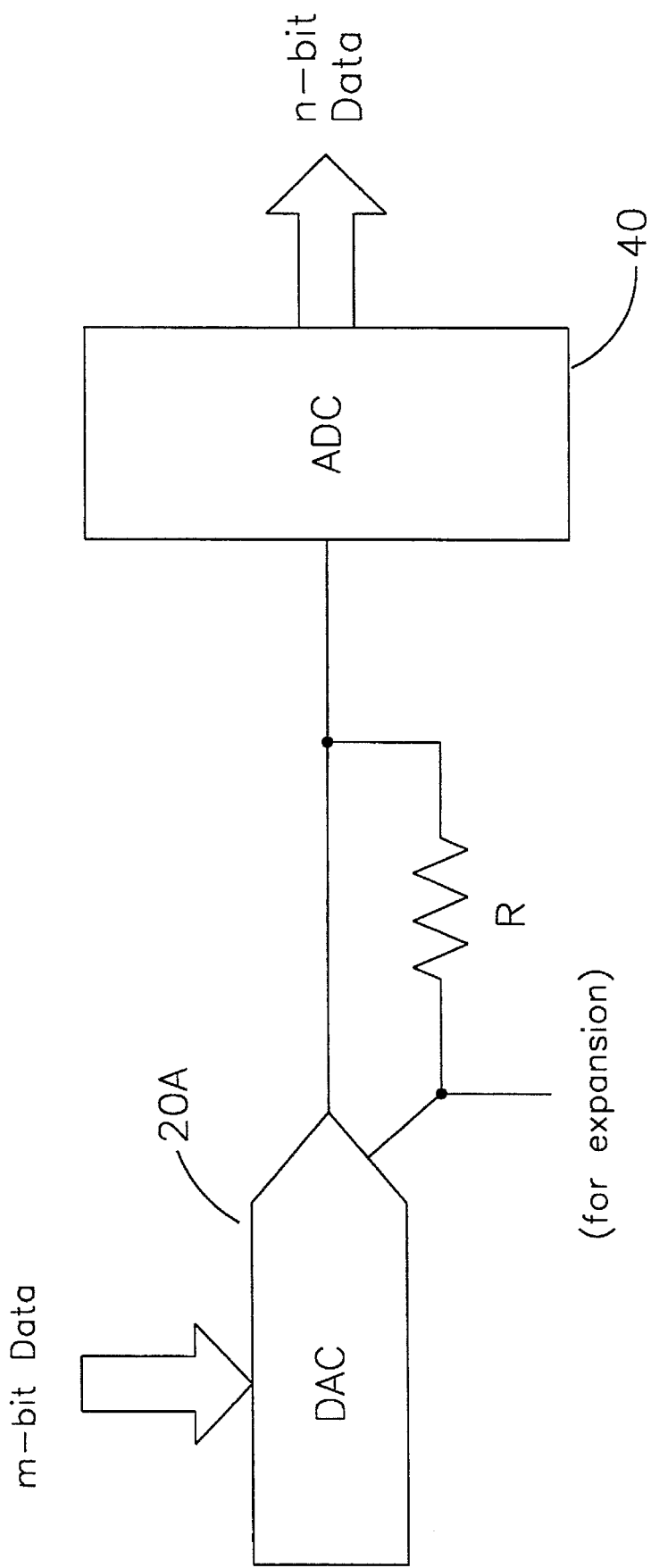
FIG. 6 shows still another alternative embodiment of the present invention of FIG. 1.

Referring to FIG. 6 there is shown still another alternative embodiment of the present invention. In the apparatus of FIG. 6, component minimization is achieved by using a voltage output DAC 20A instead of a current output device. This eliminates the Op Amp 30. Some flexibility may be lost by doing this, however, as many more types of DACs are available with the current output configuration.

Figure 7:
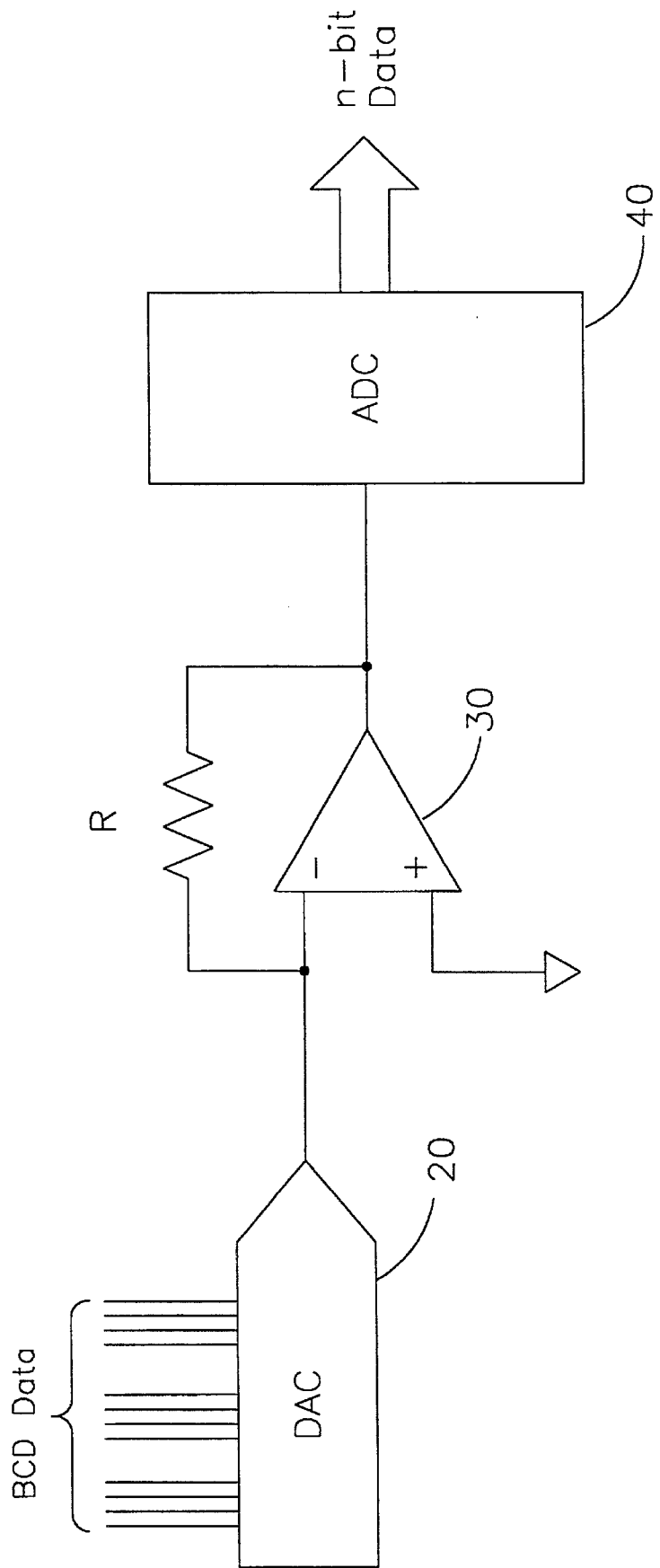
FIG. 7 shows a further alternative embodiment of the present invention of FIG. 1.

Referring to FIG. 7, there is shown yet another alternative embodiment which permits BCD data to be inputted to the DAC 20B. Binary Coded Decimal (BCD) data is transformed by either converting it to binary first with a read only memory (ROM) or appropriate digital circuitry, or by using a BCD DAC 20B. Techniques of BCD to binary conversion are well known to those skilled in the art.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

I claim:

1. An apparatus for converting an m-bit digital data having a scale factor of $K_1$ to an n-bit digital data having a scale factor of $K_2$, comprising:

a) a digital to analog converter, having an input adapted to receive the m-bit digital data, for outputting a first analog signal representative of a value associated with the m-bit digital data;

b) an amplifier, operatively connected to the digital to analog converter, for receiving the first analog signal to output a second analog signal, the amplifier having a factor of $K_2/K_1$, the second analog signal being equal to the first analog multiplied by the factor, such that the second analog signal has a value with the scale factor of $K_2$ associated therewith; and c) an analog to digital converter, having an input adapted to receive the second analog signal, for converting the second analog signal to the n-bit digital data, the n-bit digital data having the scale factor of $K_2$ associated therewith, the value representative of the n-bit digital data being essentially equal to the value representative of the m-bit digital data.

2. An apparatus according to claim 1, further comprising:
at least one additional digital to analog converter for receiving additional digital input data, the outputs of each digital to analog converter being operatively connected to the amplifier, to increase the resolution of the in-bit digital data thereby increasing the accuracy of the n-bit data being outputted from the analog to digital converter.

3. An apparatus according to claim 1, further comprising:
a reference input to the digital to analog converter for providing modifications to the scale factor of $K_1$.

4. An apparatus according to claim 1, further comprising:
an input current to the amplifier for providing an offset to the second analog signal thereby providing an offset to the n-bit digital data.

5. An apparatus according to claim 1, wherein said amplifier further comprises:
a variable feedback resistive component for modifying the factor of the amplifier thereby providing an adjustment to the scale factor of $K_2$.

6. An apparatus according to claim 1, wherein input digital data to the digital to analog converter has a binary converted decimal (BCD) format, further comprising:
a converter for converting the input digital data having the BCD format to a binary digital data format of m-bit digital data.

7. An apparatus, according to claim 6 wherein said digital to analog converter is a current output device.

8. An apparatus, according to claim 1 wherein said digital to analog converter is a current output device.

9. An apparatus for converting an m-bit digital data having a scale factor of $K_1$ to an n-bit digital data having a scale factor of $K_2$, comprising:
a) a digital to analog converter, having an input adapted to receive the m-bit digital data, for outputting a first analog signal representative of a value associated with the m-bit digital data; and
b) an analog to digital converter, having an input adapted to receive the first analog signal, for converting the first analog signal to the n-bit digital data, the n-bit digital data having the scale factor of $K_2$ associated therewith, the value representative of the n-bit digital data being essentially equal to the value representative of the m-bit digital data.

10. An apparatus, according to claim 9 further comprising:
A resistor interposed between said digital to analog converter and said analog to digital converter to provide a factor for the first analog signal such that a desired scaling value for $K_2$ is achieved.

11. An apparatus, according to claim 10 wherein said digital to analog converter is a voltage output device.

* * * * *